United States Patent
De Stasi

(12) 
(10) Patent No.: US 6,850,101 B1
(45) Date of Patent: Feb. 1, 2005

(54) SINGLE-LINE SYNCHRONIZABLE OSCILLATOR CIRCUIT

(75) Inventor: Frank De Stasi, San Leandro, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/657,506

(22) Filed: Sep. 8, 2003

(51) Int. Cl.[7] .............................................. H03L 7/00
(52) U.S. Cl. .................................... 327/141; 331/143
(58) Field of Search ............................ 327/141, 50, 54, 327/56; 331/57, 111, 143, 175

(56) References Cited

U.S. PATENT DOCUMENTS 5,668,508 A * 9/1997 Pulvirenti et al. .......... 331/111
6,456,170 B1 * 9/2002 Segawa et al. ............. 331/143

* cited by examiner

*Primary Examiner*—Linh My Nguyen
(74) *Attorney, Agent, or Firm*—Merchant & Gould; Mark Hennings

(57) ABSTRACT

Single line synchronization enables two or more oscillators to be synchronized with each other by using only a single control line. The synchronization can be accomplished without any external components. A single external component can be used to lower the frequency of an oscillator as in a master/slave-synchronized system. The use of the single control line (which can be embodied using a single integrated circuit pin) reduces the die area in which synchronization circuitry is situated. The single pin interface and reduced die area are advantageous for many applications that require small packages with a limited number of pins.

20 Claims, 5 Drawing Sheets

SINGLE-LINE SYNCHRONIZABLE OSCILLATOR CIRCUIT

FIELD OF THE INVENTION

The present invention relates to electronic oscillators circuits, and more particularly to synchronizable oscillator circuits.

BACKGROUND OF THE INVENTION

Electronic oscillators are used to provide clock signals to a wide variety of circuits such as switching power supply regulators, logic circuits, switched capacitor circuits, and the like. Often, the circuits are configured in a master-slave configuration wherein the oscillator circuit of a "slave" circuit is synchronized to an output signal generated by the oscillator of the "master" circuit. In particular, switching regulators typically require accurately synchronized switching waveforms to ensure accurate, multiple output voltages over a range of loads.

An appreciation of the present invention and its improvements can be obtained by reference to the accompanying drawings that are briefly summarized below, to the following detailed description of illustrated embodiments of the invention, and to the appended claims.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
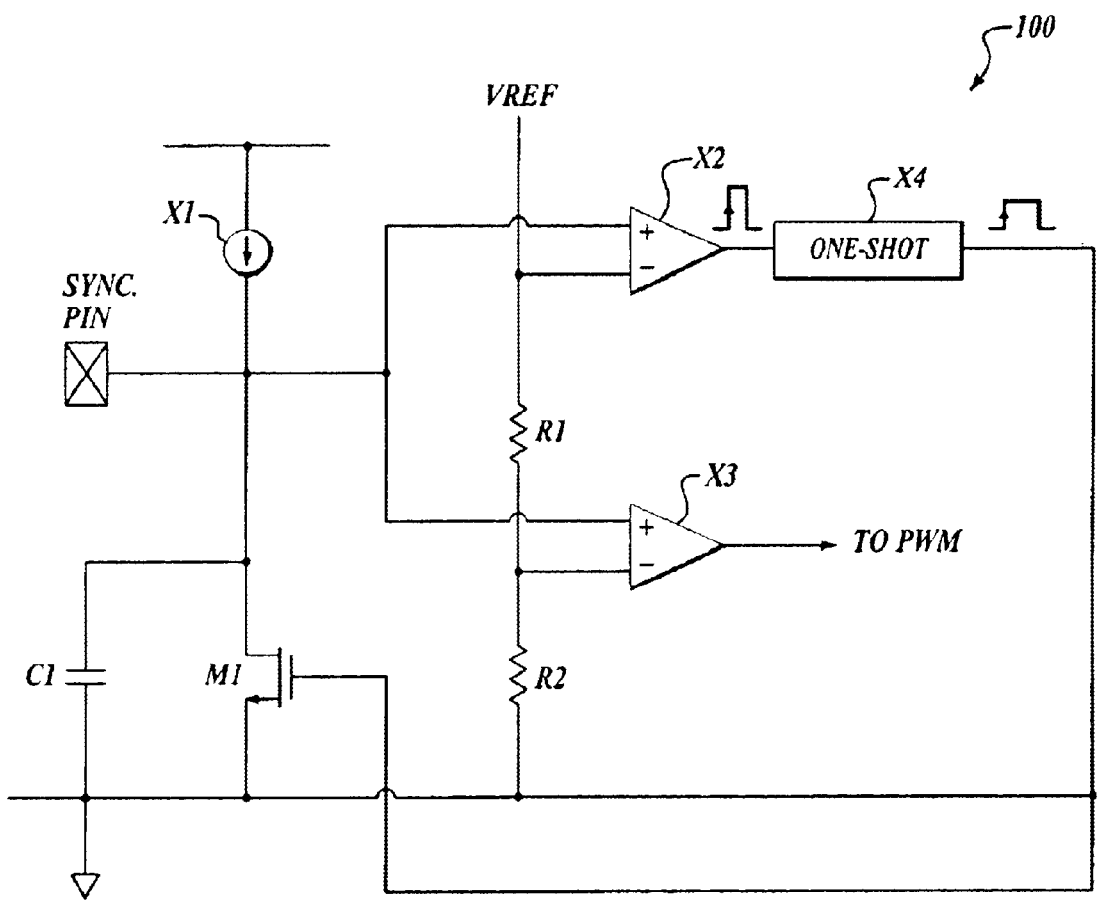
FIG. 1 illustrates an example single line synchronization circuit that is arranged in accordance with aspects of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to single line synchronization. Single line synchronization enables two or more oscillators to be synchronized with each other by using only a single control line. The synchronization can be accomplished without any external components. A single external component can be used to lower the frequency of an oscillator as in a master/slave-synchronized system. The use of the single control line (which can be embodied using a single integrated circuit pin) reduces the die area in which synchronization circuitry is situated. The single pin interface and reduced die area are advantageous for many applications that require small packages with a limited number of pins.

FIG. 1 illustrates an example single line synchronization circuit (100) that is arranged in accordance with aspects of the present invention. System 100 includes constant current source X1, comparators X2-X3, one-shot X4, capacitor C1, transistor M1, and resistors R1-R2. Comparators X2 comprises a first input that is coupled to a first reference voltage. Resistors R1-R2 are arranged to provide a second reference voltage that is less than the first reference voltage. The second reference voltage can be, for example, 80 percent of the first reference voltage. The second reference voltage is coupled to a first input of comparator X3.

Constant current source X1 and a timing circuit (comprising transistor M1 and capacitor C1) are coupled to a synchronization node (i.e., node "Sync. Pin"). The synchronization node is coupled to the second inputs of comparators X2-X3. The output of comparator X2 is coupled to the input of one-shot X4. One-shot X4 is arranged to provide a control signal in response to the transition of comparator X2. The output of one-shot X4 is coupled to the control terminal of the timing circuit (e.g., the gate of transistor M1). Transistor M1 of the timing circuit is arranged to discharge capacitor C1 in response to the output of one-shot X4. Constant current source X1 is arranged to charge timing capacitor C1 (when transistor M1 is not enabled). The output of comparator X3 is a timing-related waveform that is provided, as the main clock, to circuitry that is located on, for example, the same die as the single line synchronization circuit.

In operation, current source X1 charges capacitor C1 until the voltage of the synchronization node reaches the threshold voltage that is associated with comparator X2. One-shot X4 enables transistor M1 (by generating a pulse, for example) in response to the change in state of comparator X2. Capacitor C1 discharges during the period of time when transistor M1 is enabled. The voltage on the synchronization node decreases in response to the discharge of capacitor C1 such that the voltage of the synchronization node falls below the threshold voltage that is associated with comparator X2.

Figure 2:
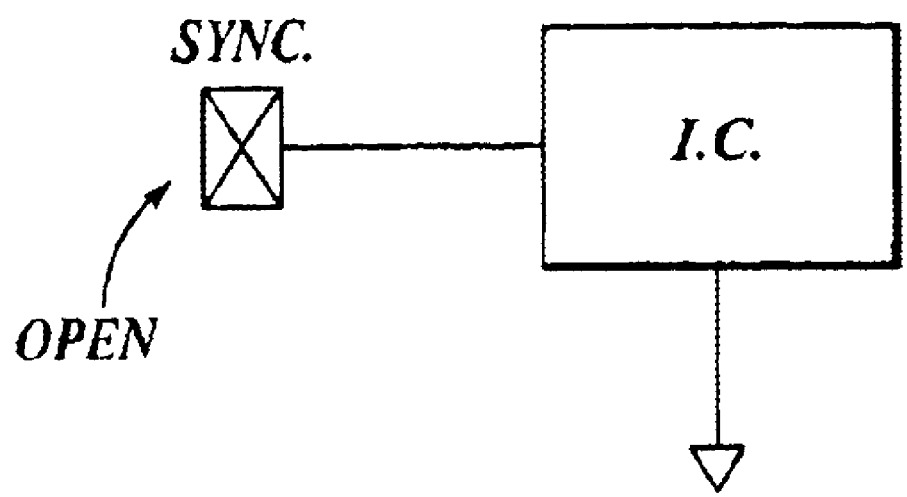
FIG. 2 is a block diagram of an example single line synchronization circuit that is configured in a free running mode in accordance with aspects of the present invention.

At the end of the pulse produced by one-shot X4, transistor M1 is disabled and the voltage on the synchronization node begins to rise again. The rising voltage eventually exceeds the reference voltage, which once again causes a change in state of comparator X2 and a triggering of one-shot X4, thereby forming an oscillating circuit. Thus, (without external stimulus upon the synchronization node) circuit 100 freely oscillates at a frequency that is uniquely determined by the components of circuit 100. FIG. 2 is a block diagram of an example single line synchronization circuit that is configured in a free running mode in accordance with aspects of the present invention.

Figure 3:
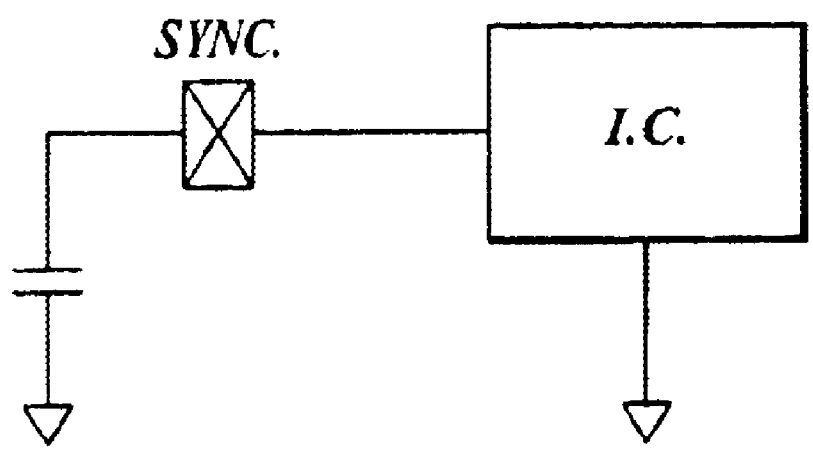
FIG. 3 is a block diagram of an example single line synchronization circuit that is configured with an external component in accordance with aspects of the present invention.

FIG. 3 is a block diagram of an example single line synchronization circuit that is configured with an external component in accordance with aspects of the present invention. As shown in the figure, external capacitor C2 is coupled to the synchronization node of circuit 100. The external capacitor C2 increases the time in which the voltage on the synchronization node reaches the threshold voltage that is associated with comparator X2. Accordingly, the frequency of the oscillation of circuit 100 is decreased when an external capacitor is coupled to the synchronization node.

Figure 4:
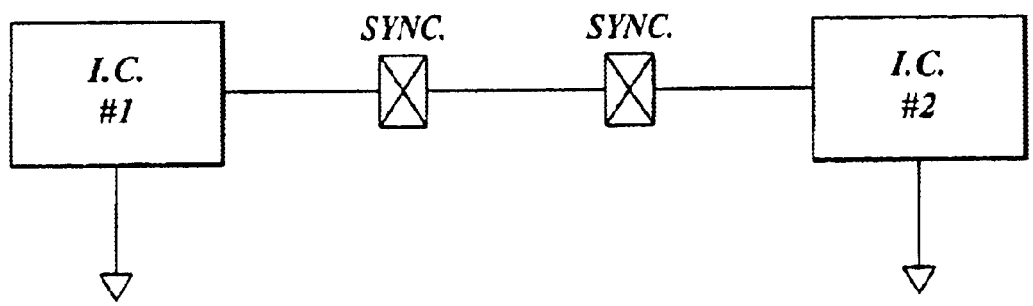
FIG. 4 is a block diagram of two example single line synchronization circuits that are arranged in a master/slave configuration in accordance with aspects of the present invention.

FIG. 4 is a block diagram of two example single line synchronization circuits that are arranged in a master/slave configuration in accordance with aspects of the present invention. As shown in the figure, the synchronization node of a first circuit 100 is coupled to the synchronization node of a second circuit 100. One of the first and second circuits 100 operates as a master and the other operates as a slave. The circuit 100 having a lower first voltage reference, or smaller value of capacitor C1, or larger value of current source X1, (as compared to the other circuit 100) or for any other reason having a higher free running frequency operates as the master. The above-mentioned causes of a higher frequency can result from, for example, typical variances in manufacturing of the components (such as capacitor C1) within circuits 100.

Figure 5:
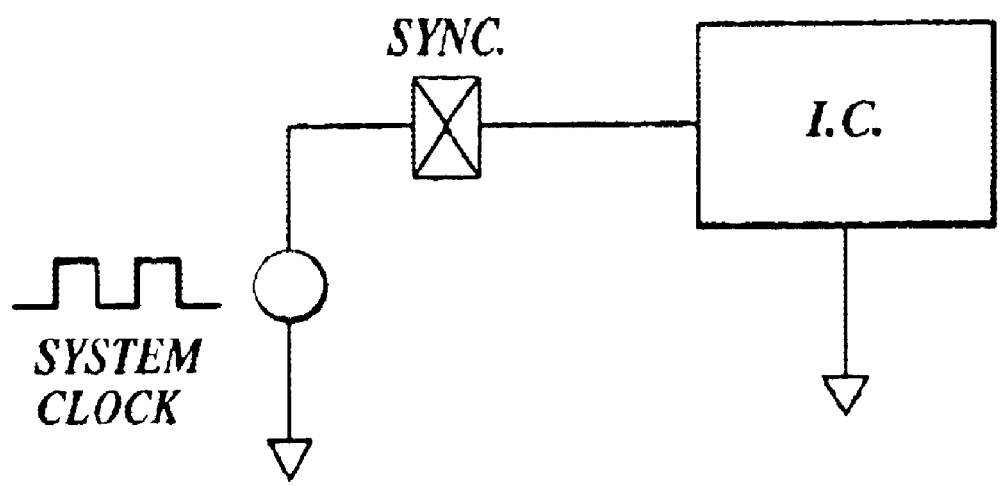
FIG. 5 is a block diagram of an example single line synchronization circuit that is coupled to an external clock in accordance with aspects of the present invention.

FIG. 5 is a block diagram of an example single line synchronization circuit that is coupled to an external clock in accordance with aspects of the present invention. The external clock adjusts the voltage on the synchronization node such that the state of comparator X2 is toggled at the rate of the external clock. Likewise, the state of comparator X3 is toggled at the rate of the external clock such that the circuitry (such as a PWM-controlled switching regulator) collocated on the die of circuit 100 is switched at the rate of the system clock.

The N-channel of discharge transistor M1 typically has a drain-to-source resistance that is large compared to the drive capability of the system clock. The system clock also typically has a drive capability that is able to discharge (the relatively small) timing capacitor C1.

Various embodiments of the invention are possible without departing from the spirit and scope of the invention. For example, complementary logic (and components) can be used in accordance with the embodiment described above. Although the above embodiment is described as locating circuits 100 on separate dice, embodiments of the invention can be practiced on any pin-limited block or device. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for synchronizing circuitry using a single line, comprising:
   charging a first synchronization node that is located on a first die;
   comparing a voltage of the first synchronization node with a first reference voltage;
   comparing a voltage of the first synchronization node with a second reference voltage that is lower than the first reference voltage;
   discharging the first synchronization node for a period of time such that the voltage of the first synchronization node falls below first and second threshold voltages in response to a comparison wherein the voltage of the first synchronization node exceeds the first reference voltage; and
   driving circuitry of the first die in response to comparing a voltage of the first synchronization node with the second reference voltage.

2. The method of claim 1, further comprising coupling a capacitor that is not situated on the first die to the first synchronization node.

3. The method of claim 1, further comprising applying an external clock signal that is not generated on the first die to the first synchronization node.

4. The method of claim 1, wherein the driving circuitry on the first die is a PWM switching circuit.

5. The method of claim 1, farther comprising:
   coupling a second synchronization node that is on a second die that is different from the first die to the first synchronization node such that the voltage of the first synchronization node is substantially equal to the voltage of the second synchronization node;
   comparing a voltage of the second synchronization node with a third reference voltage;
   comparing a voltage of the second synchronization node with a fourth reference voltage that is lower than the third reference voltage;
   discharging the second synchronization node for a period of time such that the voltage of the second synchronization node falls below second, third and fourth threshold voltages in response to a comparison wherein the voltage of the second synchronization node exceeds the third reference voltage; and
   driving circuitry of the second die in response to comparing a voltage of the second synchronization node with a fourth reference voltage.

6. The method of claim 5, further comprising coupling a capacitor that is not situated on one of the first and second dice to the first synchronization node.

7. The method of claim 1, further comprising using a constant current source to charge the first synchronization node.

8. A circuit for synchronizing circuitry using a single line, comprising:
   means for charging a first synchronization node that is located on a first die;
   a first reference voltage comparison means for comparing a voltage of the first synchronization node with a first reference voltage;
   a second reference voltage comparison means for comparing a voltage of the first synchronization node with a second reference voltage that is lower than the first reference voltage;
   means for discharging the first synchronization node for a period of time such that the voltage of the first synchronization node falls below first and second threshold voltages in response to the first reference voltage comparison means detecting when the voltage of the first synchronization node exceeds the first reference voltage; and means for driving circuitry of the first die in response to comparing a voltage of the first synchronization node with the second reference voltage.

9. The circuit of claim 8, further comprising means for coupling a capacitor that is not situated on the first die to the first synchronization node.

10. The circuit of claim 8, further comprising means for applying an external clock signal that is not generated on the first die to the first synchronization node.

11. The circuit of claim 8, wherein the driving circuitry on the first die is a PWM switching circuit.

12. The circuit of claim 9, further comprising:
means for coupling a second synchronization node that is on a second die that is different from the first die to the first synchronization node such that the voltage of the first synchronization node is substantially equal to the voltage of the second synchronization node;
a third reference voltage comparison means for comparing a voltage of the second synchronization node with a third reference voltage;
a fourth reference voltage comparison means for comparing a voltage of the second synchronization node with a fourth reference voltage that is lower than the third reference voltage;
means for discharging the second synchronization node for a period of time such that the voltage of the second synchronization node falls below second, third and fourth threshold voltages in response to the third reference voltage comparison means detecting when the voltage of the second synchronization node exceeds the third reference voltage; and
means for driving circuitry of the second die in response to comparing a voltage of the second synchronization node with the fourth reference voltage.

13. The circuit of claim 12, further comprising means for coupling a capacitor that is not situated on one of the first and second dice to the first synchronization node.

14. The circuit of claim 1, further comprising using a constant current source means to charge the first synchronization node.

15. A circuit for synchronizing circuitry using a single line, comprising:
a first current source that is configured to charge a first synchronization node that is located on a first die;
a first comparator that is configured to compare a voltage of the first synchronization node with a first reference voltage;
a second comparator that is configured to compare a voltage of the first synchronization node with a second reference voltage that is lower than the first reference voltage;
a first switching circuit that is configured to discharge the first synchronization node for a period of time such that the voltage of the first synchronization node falls below first and second threshold voltages in response to a comparison wherein the voltage of the first synchronization node exceeds the first reference voltage; and
a first driving circuit that is configured to drive circuitry of the first die in response to the output of the second comparator.

16. The circuit of claim 15, further comprising a capacitor that is not situated on the first die and that is coupled to the first synchronization node.

17. The circuit of claim 15, further comprising an external clock generator that is not on the first die for generating a clock signal that is applied to the first synchronization node.

18. The circuit of claim 15, wherein the driving circuitry on the first die is a PWM switching circuit.

19. The circuit of claim 15, further comprising:
a second current source that is coupled to a second synchronization node that is on a second die that is different from the first die to the first synchronization node and is coupled to the first synchronization node such that the voltage of the first synchronization node is substantially equal to the voltage of the second synchronization node;
a third comparator that is configured to compare the voltage of the second synchronization node with a third reference voltage;
a fourth comparator that is configured to compare the voltage of the second synchronization node with a fourth reference voltage that is lower than the third reference voltage;
a second switching circuit discharging the second synchronization node for a period of time such that the voltage of the second synchronization node falls below second, third and fourth threshold voltages in response to the third reference voltage comparison means detecting when the voltage of the second synchronization node exceeds the third reference voltage; and
a second driving circuit that is configured to drive circuitry in response to comparing a voltage of the second synchronization node with the fourth reference voltage.

20. The circuit of claim 19, further comprising a capacitor that is not situated on one of the first and second dice and that is coupled to the first synchronization node.

* * * * *